(12) United States Patent
Shin (10) Patent No.: US 10,985,553 B2
(45) Date of Patent: Apr. 20, 2021

(54) METHOD AND APPARATUS FOR DETECTING BATTERY LEAKAGE

(71) Applicant: LG Chem, Ltd., Seoul (KR)

(72) Inventor: Hyeon-Ju Shin, Daejeon (KR)

(73) Assignee: LG Chem, Ltd.

( * ) Notice: Subject to any disclaimer, the term of this patent is extended or adjusted under 35 U.S.C. 154(b) by 0 days.

(21) Appl. No.: 16/626,411

(22) PCT Filed: Dec. 7, 2018

(86) PCT No.: PCT/KR2018/015568
§ 371 (c)(1),
(2) Date: Dec. 24, 2019

(87) PCT Pub. No.: WO2019/117556
PCT Pub. Date: Jun. 20, 2019

(65) Prior Publication Data
US 2020/0144812 A1     May 7, 2020

(30) Foreign Application Priority Data
Dec. 15, 2017   (KR) ........................ 10-2017-0173495

(51) Int. Cl.
*H02H 7/18*      (2006.01)
*G01R 31/385*    (2019.01)
(Continued)

(52) U.S. Cl.
CPC ............. *H02H 7/18* (2013.01); *G01R 31/385* (2019.01); *G01R 31/52* (2020.01); *H02H 1/0007* (2013.01)

(58) Field of Classification Search
CPC ........ H02H 7/18; H02H 1/0007; G01R 31/52; G01R 31/3385
See application file for complete search history.

(56) References Cited

U.S. PATENT DOCUMENTS

2003/0030440 A1   2/2003   Yugou
2003/0042909 A1   3/2003   Yamamoto et al.
(Continued)

FOREIGN PATENT DOCUMENTS

DE   102013013950 A1   2/2015
JP      200145652 A    2/2001
(Continued)

OTHER PUBLICATIONS

International Search Report for PCT/KR2018/015568 dated Mar. 21, 2019.
(Continued)

*Primary Examiner* — Harry R Behm
(74) *Attorney, Agent, or Firm* — Lerner, David, Littenberg, Krumholz & Mentlik, LLP (57) ABSTRACT

A method and apparatus for detecting battery leakage. The method includes determining whether an insulation resistance value difference is smaller than a preset reference difference when a representative insulation resistance value is larger than a preset reference resistance value, wherein the insulation resistance value difference is a difference between a previous representative insulation resistance value and the representative insulation resistance value, allocating a first value to a diagnosis flag when the insulation resistance value difference is smaller than the reference difference, allocating a second value to the diagnosis flag when the insulation resistance value difference is equal to or larger than the reference difference, and activating a count indicator when the second value is allocated to the diagnosis flag. The first value indicates that the representative insulation resistance value is valid. The second value indicates that the representative insulation resistance value is invalid.

10 Claims, 9 Drawing Sheets

(51) Int. Cl.
*G01R 31/52* (2020.01)
*H02H 1/00* (2006.01)

(56) References Cited

U.S. PATENT DOCUMENTS

| | | |
|---|---|---|
| 2004/0243288 A1 | 12/2004 | Kito et al. |
| 2009/0096464 A1 | 4/2009 | Tanaka et al. |
| 2010/0156426 A1 | 6/2010 | Kang et al. |
| 2010/0237872 A1 | 9/2010 | Kang et al. |
| 2011/0057660 A1* | 3/2011 | Kagoshima ............... B60L 3/04 324/509 |
| 2012/0223734 A1 | 9/2012 | Takada et al. |
| 2013/0197745 A1 | 8/2013 | Skelton et al. |
| 2013/0245869 A1* | 9/2013 | Nishida .................. B60L 15/20 701/22 |
| 2014/0039740 A1 | 2/2014 | Kwon et al. |
| 2014/0084933 A1 | 3/2014 | Jang et al. |
| 2015/0168497 A1 | 6/2015 | Tabatowski-Bush |
| 2016/0202301 A1 | 7/2016 | Mizoguchi et al. |
| 2016/0334452 A1 | 11/2016 | Mensler et al. |
| 2020/0180452 A1* | 6/2020 | Lee ........................ B60L 53/62 |

FOREIGN PATENT DOCUMENTS

| | | |
|---|---|---|
| JP | 2003066090 A | 3/2003 |
| JP | 2007300753 A | 11/2007 |
| JP | 2009093822 A | 4/2009 |
| JP | 2011035985 A | 2/2011 |
| JP | 2013150421 A | 8/2013 |
| JP | 201425760 A | 2/2014 |
| JP | 2014508939 A | 4/2014 |
| JP | 2016128753 A | 7/2016 |
| JP | 2016189689 A | 11/2016 |
| JP | 2017501396 A | 1/2017 |
| KR | 20030010582 A | 2/2003 |
| KR | 20130112802 A | 10/2013 |
| KR | 101371854 B1 | 3/2014 |
| KR | 101512395 B1 | 4/2015 |
| KR | 20160069800 A | 6/2016 |
| KR | 101735739 B1 | 5/2017 |

OTHER PUBLICATIONS

Extended European Search Report including Written Opinion for EP188873392 dated Oct. 30, 2020; 10 pages.

* cited by examiner

FIG. 9 ise> # METHOD AND APPARATUS FOR DETECTING BATTERY LEAKAGE

CROSS-REFERENCE TO RELATED APPLICATIONS

The present application is a national phase entry under 35 U.S.C. § 371 of International Application No. PCT/KR2018/015568 filed Dec. 7, 2018, published in Korean, which claims priority from Korean Patent Application No. 10-2017-0173495 filed Dec. 15, 2017, all of which are incorporated herein by reference.

TECHNICAL FIELD

The present disclosure relates to a method and apparatus for detecting battery leakage, and more particularly, to a method and apparatus for detecting battery leakage based on insulation resistance between the battery and the ground.

BACKGROUND ART

Recently, with concerns about the exhaust of fossil energy and environmental pollution, interests in electric products that can operate using electrical energy instead of fossil energy are increasing.

With the increasing technology development and demand for mobile devices, electric vehicles, hybrid electric vehicles, energy storage systems and uninterruptible power supply systems, there is a dramatic increase in demand for secondary batteries as a source of energy and the demand comes in diverse forms. To meet the demand, many studies are being made on batteries including secondary batteries.

Meanwhile, an apparatus using a high-output high-voltage (e.g., a few hundreds of volts [V]) battery such as an electric vehicle or a hybrid electric vehicle needs to maintain an insulation state of the battery from the ground (e.g., the vehicle body itself) well. When the insulation state of the battery is not maintained, that is, when an insulation resistance value between the battery and the ground is equal to or less than a predetermined value, a high leakage current flows from the battery, causing maloperation of peripheral electronic devices and electric shock accidents.

Battery leakage detection technologies have been disclosed, and most of these technologies focus on calculating an insulation resistance value more quickly or more accurately.

In general, the insulation resistance value is periodically calculated in a predetermined cycle. However, due to various factors such as noise from the outside, the calculated insulation resistance may be temporally different from the actual insulation resistance.

SUMMARY

Technical Problem

The present disclosure is directed to providing a method and apparatus for detecting battery leakage based on whether an insulation resistance value between the battery and the ground is equal to or less than a reference resistance value consecutively more than a reference number of times.

The present disclosure is further directed to providing a method and apparatus for adjusting a count utilized as a standard for determining whether the battery leaks based on the insulation resistance value of the battery.

These and other objects and advantages of the present disclosure will be understood by the following description and will be apparent from the embodiments of the present disclosure. Further, it will be readily understood that the objects and advantages of the present disclosure can be realized by the means set forth in the appended claims and combinations thereof.

Technical Solution

A method for detecting battery leakage according to an embodiment of the present disclosure includes calculating a representative insulation resistance value between a battery and a ground, determining whether the representative insulation resistance value is larger than a preset reference resistance value, determining whether an insulation resistance value difference is smaller than a preset reference difference when the representative insulation resistance value is larger than the preset reference resistance value, wherein the insulation resistance value difference is a difference between a previous representative insulation resistance value and the representative insulation resistance value, allocating a first value—the first value indicating that the representative insulation resistance value is valid—to a diagnosis flag when the insulation resistance value difference is smaller than the preset reference difference, allocating a second value—the second value indicating that the representative insulation resistance value is invalid—to the diagnosis flag when the insulation resistance value difference is equal to or larger than the preset reference difference, and activating a count indicator when the second value is allocated to the diagnosis flag.

The representative insulation resistance value may be a smaller one of a first insulation resistance value between a positive terminal of the battery and the ground and a second insulation resistance value between a negative terminal of the battery and the ground.

The method may further include increasing a fault count value when the representative insulation resistance value is equal to or less than the preset reference resistance value, determining whether the count indicator is activated when the representative insulation resistance value is equal to or less than the preset reference resistance value, after increasing the fault count value, determining whether the fault count value is equal to or larger than a preset first count value when the count indicator is not activated, and performing a protection operation when the fault count value is equal to or larger than the preset first count value.

The method may further include, after increasing the fault count value, determining whether the fault count value is equal to or larger than a preset second count value when the count indicator is activated, and performing the protection operation when the fault count value is equal to or larger than the preset second count value.

The preset second count value may be smaller than the preset first count value.

The protection operation may include turning off a safety switch installed between two adjacent battery cells connected in series within the battery.

An apparatus for detecting battery leakage according to another embodiment of the present disclosure includes a switching unit including a first switch and a second switch, a first voltage dividing unit including a first protection resistor and a first reference resistor connected in series between a positive terminal of a battery and a ground when the first switch is turned on, a second voltage dividing unit including a second protection resistor and a second reference resistor connected in series between a negative terminal of the battery and the ground when the second switch is turned on, a voltage sensor configured to measure a first detected voltage from the first voltage dividing unit and a second detected voltage from the second voltage dividing unit, a switch control configured to independently control the first switch and the second switch, and a controller configured to calculate a first insulation resistance value between the positive terminal of the battery and the ground and a second insulation resistance value between the negative terminal of the battery and the ground, based on the first detected voltage measured by the voltage sensor while a first circuit is formed by the first switch being turned on and the second switch being turned off and the second detected voltage measured by the voltage sensor while a second circuit is formed by the first switch being turned off and the second switch being turned on. The controller is configured to determine whether a representative insulation resistance value is larger than a preset reference resistance value, wherein the representative insulation resistance value is any one of the first insulation resistance value and the second insulation resistance value. The controller is configured to determine whether an insulation resistance value difference is smaller than a preset reference difference when the representative insulation resistance value is larger than the preset reference resistance value, wherein the insulation resistance value difference is a difference between a previous representative insulation resistance value and the representative insulation resistance value. The controller is configured to allocate a first value—the first value indicating that the representative insulation resistance value is valid— to a diagnosis flag when the insulation resistance value difference is smaller than the preset reference difference. The controller is configured to allocate a second value—the second value indicating that the representative insulation resistance value is invalid—to the diagnosis flag when the insulation resistance value difference is equal to or larger than the preset reference difference. The controller is configured to activate a count indicator when the second value is allocated to the diagnosis flag. The controller is configured to increase a fault count value when the representative insulation resistance value is equal to or less than the preset reference resistance value. The controller is configured to, after the fault count value is increased, determine whether the fault count value is equal to or larger than a preset first count value when the count indicator is not activated. The controller is configured to perform a protection operation when the increased fault count value is equal to or larger than the preset first count value.

The controller may be configured to, after the fault count value is increased, determine whether the fault count value is larger than a preset second count when the count indicator is activated. The preset second count is smaller than the preset first count. The controller may be configured to perform the protection operation when the increased fault count is larger than the preset second count.

The protection operation may include turning off a safety switch installed between two adjacent battery cells connected in series within the battery.

A battery pack according to still another embodiment of the present disclosure includes the apparatus of any of the embodiments described herein.

Advantageous Effects

According to at least one of the embodiments of the present disclosure, it is possible to detect battery leakage based on whether an insulation resistance value between the battery and the ground is equal to or less than a reference resistance value consecutively more than a reference number of times.

Additionally, according to at least one of the embodiments of the present disclosure, it is possible to adjust a count used as a reference for determining whether the battery leaks based on the insulation resistance value of the battery.

The effects of the present disclosure are not limited to the above-mentioned effects, and other effects not mentioned herein will be clearly understood by those skilled in the art from the appended claims.

DESCRIPTION OF DRAWINGS

The accompanying drawings illustrate a preferred embodiment of the present disclosure, and together with the following detailed description of the present disclosure, serve to provide a further understanding of the technical aspects of the present disclosure, and thus the present disclosure should not be construed as limited to the drawings.

DETAILED DESCRIPTION

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could be made thereto at the time of filing the application.

Additionally, in describing the present disclosure, when it is deemed that a certain detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Unless the context clearly indicates otherwise, it will be understood that the term "comprises" or "includes" when used in this specification, specifies the presence of stated elements, but does not preclude the presence or addition of one or more other elements. Additionally, the term "control unit" as used herein refers to a processing unit of at least one function or operation, and this may be implemented by hardware or software alone or in combination.

In addition, throughout the specification, it will be further understood that when an element is referred to as being "connected to" another element, it can be directly connected to the other element or intervening elements may be present.

Figure 1:
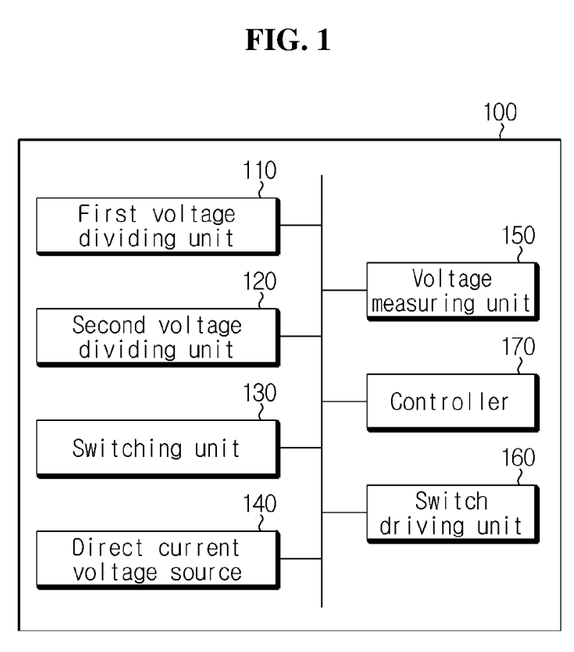
FIG. 1 is a schematic diagram showing the functional configuration of a battery leakage detection apparatus according to an embodiment of the present disclosure.
Figure 2:
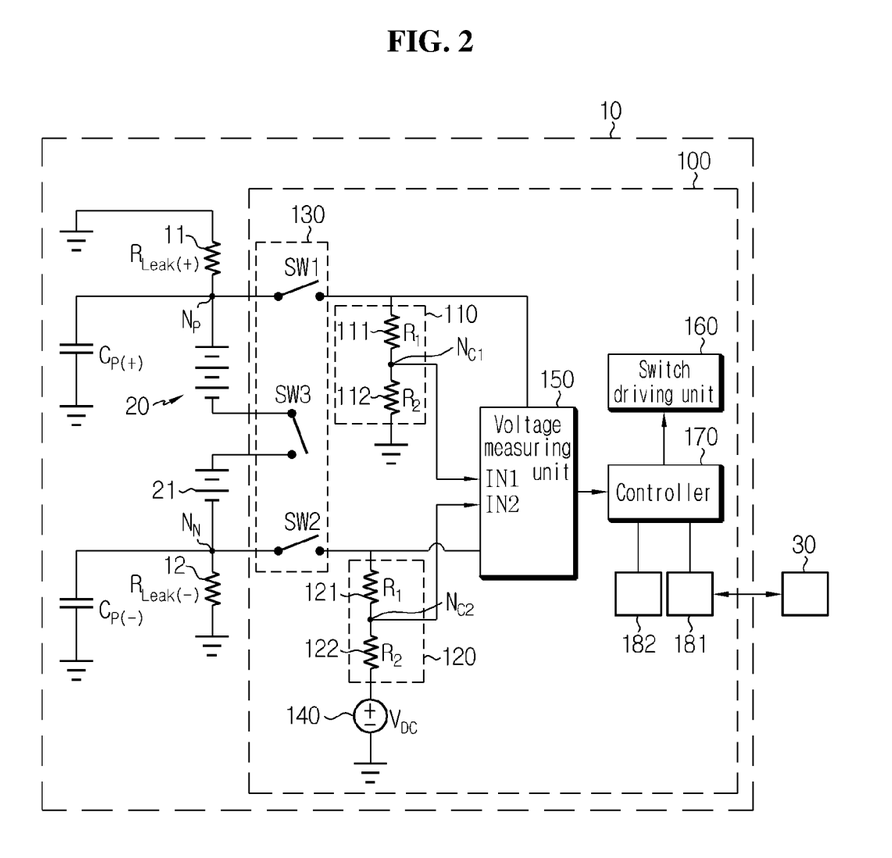
FIG. 2 is a schematic diagram showing the circuit configuration of a battery pack according to an embodiment of the present disclosure.

FIG. 1 is a schematic diagram showing the functional configuration of a battery leakage detection apparatus 100 according to an embodiment of the present disclosure, and FIG. 2 is a schematic diagram showing the circuit configuration of a battery pack 10 according to an embodiment of the present disclosure.

Referring to FIGS. 1 and 2, the battery pack 10 includes a battery 20 and the battery leakage detection apparatus 100. Here, the battery 20 refers to a single battery cell 21 or an assembly of battery cells (not shown), and the assembly of battery cells may include a plurality of battery cells connected in series, in parallel, or in series and in parallel.

The battery cell 21 may be an electric double layer capacitor including an ultra capacitor or a secondary battery such as a lithium ion battery, a lithium polymer battery, a nickel cadmium battery, a nickel hydrogen battery and a nickel zinc battery.

The battery leakage detection apparatus 100 includes a first voltage dividing unit 110, a second voltage dividing unit 120, a switching unit 130, a voltage measuring unit 150, a switch driving unit 160 and a controller 170. The battery leakage detection apparatus 100 is electrically connected to a positive terminal $N_P$ and a negative terminal $N_N$ of the battery 20.

FIG. 2 shows two insulation resistors 11, 12 electrically connected to the positive terminal $N_P$ and the negative terminal $N_N$ of the battery 20 respectively. In detail, the first insulation resistor 11 is connected between the positive terminal $N_P$ of the battery 20 and the ground, and the second insulation resistor 12 is connected between the negative terminal $N_N$ of the battery 20 and the ground.

Each of the two insulation resistors 11, 12 may be a virtual equivalent resistor for indicating the insulation state of the battery 20 from the ground. When the insulation state between the battery 20 and the ground is maintained well, resistance values $R_{Leak(+)}$, $R_{Leak(-)}$ of the first and second insulation resistors 11, 12 will be each larger than a reference resistance value that is preset. On the contrary, when the insulation state between the battery 20 and the ground is bad, the resistance value of at least one of the first and second insulation resistors 11, 12 will be equal to or less than the reference resistance value.

Additionally, FIG. 2 shows parasitic capacitors $C_{P(+)}$, $C_{P(-)}$ electrically connected to the positive terminal $N_P$ and the negative terminal $N_N$ of the battery 20 respectively. In detail, the positive side parasitic capacitor $C_{P+}$ is connected between the positive terminal $N_P$ of the battery 20 and the ground, and the negative side parasitic capacitor $C_{P(-)}$ is connected between the negative terminal $N_N$ of the battery 20 and the ground. Similar to the above-described insulation resistors 11, 12, the parasitic capacitors $C_{P(+)}$, $C_{P(-)}$ may be a virtual equivalent capacitor for indicating the capacitor component between the positive terminal $N_P$ of the battery 20 and the ground and between the negative terminal $N_N$ of the battery 20 and the ground. As shown in FIG. 2, the parasitic capacitors $C_{P(+)}$, $C_{P(-)}$ may be equalized by being connected in parallel to the insulation resistors 11, 12 respectively.

The first voltage dividing unit 110 includes a first protection resistor 111 and a first reference resistor 112. The first protection resistor 111 and the first reference resistor 112 are connected to each other through a first common node $N_{C1}$.

The second voltage dividing unit 120 includes a second protection resistor 121 and a second reference resistor 122. The second protection resistor 121 and the second reference resistor 122 are connected to each other through a second common node $N_{C2}$.

According to embodiments, the battery leakage detection apparatus 100 may further include a direct current voltage source 140 connected between the second reference resistor 122 and the ground. The second reference resistor 122 is connected between the negative terminal $N_N$ of the battery 20 and the ground, therefore a voltage applied between the second common node $N_{C2}$ and the ground may be a negative value. Accordingly, the direct current voltage source 140 may be provided to make the voltage applied between the second common node $N_{C2}$ and the ground have a positive value. A voltage value $V_{DC}$ outputted from the direct current voltage source 140 may be set such that the voltage applied between the second common node $N_{C2}$ and the ground is a positive value (i.e., the second detected voltage is equal to or higher than 0V), and may be pre-stored in memory embedded in the controller 170.

The switching unit 130 may include a first switch SW1 and a second switch SW2. The first switch SW1 may be connected between the positive terminal $N_P$ and the first voltage dividing unit 110. The second switch SW2 may be connected between the negative terminal $N_N$ and the second voltage dividing unit 120.

The first switch SW1 and the second switch SW2 may be controlled independently of each other in response to a signal outputted from the switch driving unit 160. That is, the first switch SW1 and the second switch SW2 may be turned on or off respectively, and the controller 170 may selectively execute a maximum of four switching modes by such combination. Each switching mode may be executed only while the battery 20 is under the no-load condition. The no-load condition refers to a condition in which charging and discharging of the battery 20 is stopped. The four switching modes include a first switching mode in which the first switch SW1 and the second switch SW2 are 'turned on-turned off', a second switching mode in which the first switch SW1 and the second switch SW2 are 'turned off-turned on', a third switching mode in which the first switch SW1 and the second switch SW2 are 'turned on-turned on', and a fourth switching mode in which the first switch SW1 and the second switch SW2 are 'turned off-turned off'. Accordingly, four different circuits may be selectively formed within the battery pack 10 in each switching mode. The switching unit 130 may further include a safety switch SW3.

The safety switch SW3 is provided to selectively cut off the electrical connection between some of the plurality of battery cells included in the battery 20 and the remaining battery cells. The safety switch SW3 may be installed between any two adjacent battery cells connected in series within the battery 20. When the safety switch SW3 is turned off, the use (i.e., charging and discharging) of the battery 20 is stopped. When the switching unit 130 includes the safety switch SW3, the above-described four switching modes may be executed while the safety switch SW3 is turned on.

When the first switch SW1 is turned on, the first protection resistor 111 and the first reference resistor 112 may be connected in series between the positive terminal $N_P$ of the battery 20 and the ground. When the first switch SW1 is turned off, the first protection resistor 111 and the first reference resistor 112 may be electrically separated from the positive terminal $N_P$ of the battery 20.

In detail, one end of the first protection resistor 111 and one end of the first reference resistor 112 are connected to each other through the first common node $N_{C1}$. Additionally, the other end of the first protection resistor 111 is connected or separated to/from the positive terminal $N_P$ through the first switch SW1. Additionally, the other end of the first reference resistor 112 is connected to the ground.

When the second switch SW2 is turned on, the second protection resistor 121 and the second reference resistor 122 may be connected in series between the negative terminal $N_N$ of the battery 20 and the ground. When the second switch SW2 is turned off, the second protection resistor 121 and the second reference resistor 122 may be electrically separated from the negative terminal $N_N$ of the battery 20.

In detail, one end of the second protection resistor 121 and one end of the second reference resistor 122 are connected to each other through the second common node $N_{C2}$. Additionally, the other end of the second protection resistor 121 is connected or separated to/from the negative terminal $N_N$ through the second switch SW2. Additionally, the other end of the second reference resistor 122 is connected to the ground.

Each resistance value of the first protection resistor 111, the first reference resistor 112, the second protection resistor 121 and the second reference resistor 122 may be pre-stored in the controller 170. Preferably, a ratio between the resistance value of the first protection resistor 111 and the resistance value of the first reference resistor 112 may be equal to a ratio between the resistance value of the second protection resistor 121 and the resistance value of the second reference resistor 122. For example, the resistance value of the first protection resistor 111 and the resistance value of the second protection resistor 121 may be equal to each other, and the resistance value of the first reference resistor 112 and the resistance value of the second reference resistor 122 may be equal to each other. Hereinafter, it is assumed that the resistance value of the first protection resistor 111 and the resistance value of the second protection resistor 121 are equal to each other as $R_1$, and the resistance value of the first reference resistor 112 and the resistance value of the second reference resistor 122 are equal to each other as $R_2$.

The voltage applied to the first voltage dividing unit 110 may be divided according to the ratio between the resistance value of the first protection resistor 111 and the resistance value of the first reference resistor 112, and measured by the voltage measuring unit 150. Likewise, the voltage applied to the second voltage dividing unit 120 may be divided according to the ratio between the resistance value of the second protection resistor 121 and the resistance value of the second reference resistor 122, and measured by the voltage measuring unit 150.

The switch driving unit 160 may independently control the first switch SW1 and the second switch SW2. That is, the switch driving unit 160 may selectively turn on or off the first switch SW1 and the second switch SW2. The switch driving unit 160 may form different circuits in the battery pack 10 by controlling the first switch SW1 and the second switch SW2.

In more detail, the switch driving unit 160 may form various circuits as below by controlling the first switch SW1 and the second switch SW2.

Figure 3:
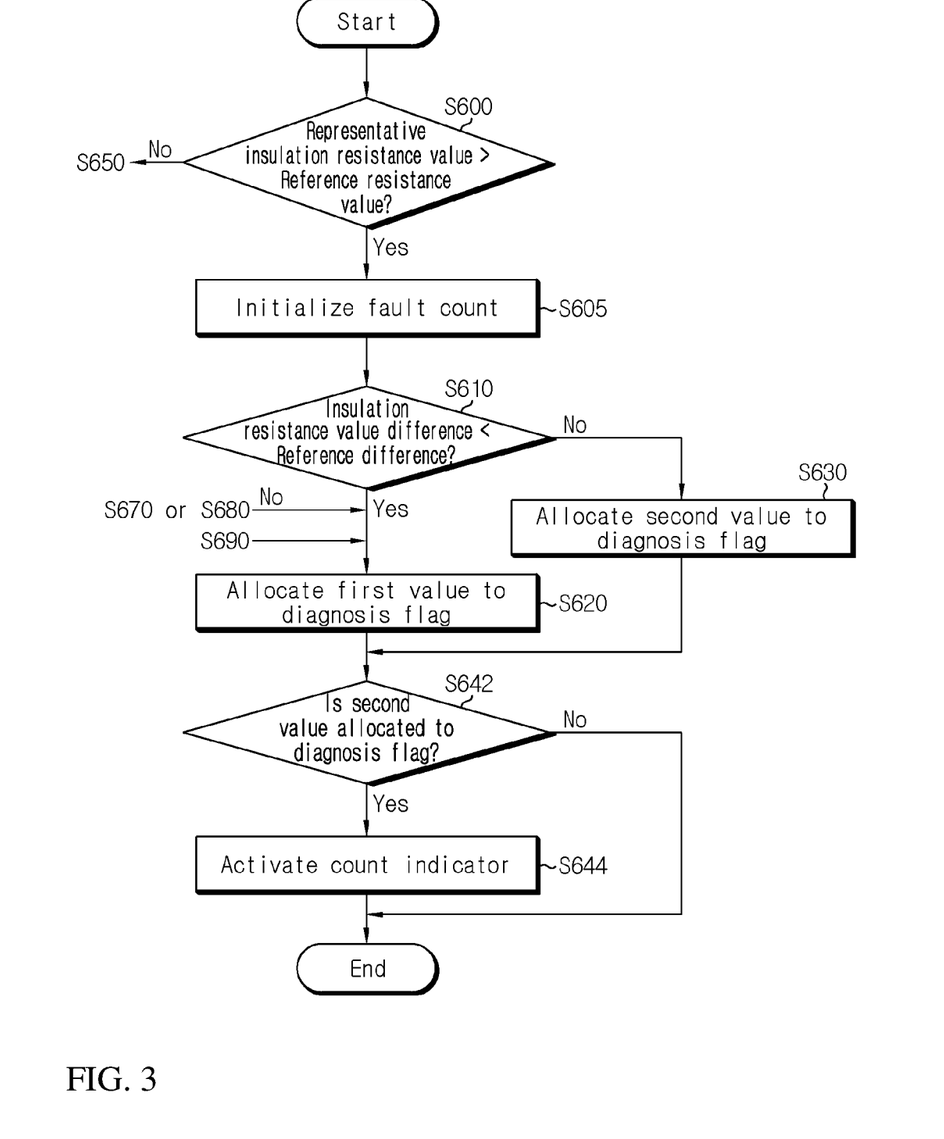
FIG. 3 is a schematic circuit diagram showing a first circuit formed in a battery pack by a first switching mode.

In the first switching mode, the switch driving unit 160 may turn on the first switch SW1 and turn off the second switch SW2 to form a first circuit (CC1 in FIG. 3). The first circuit CC1 refers to a circuit in which the first voltage dividing unit 110 is electrically connected to the positive terminal $N_P$, and the second voltage dividing unit 120 is electrically separated from the negative terminal $N_N$.

Figure 4:
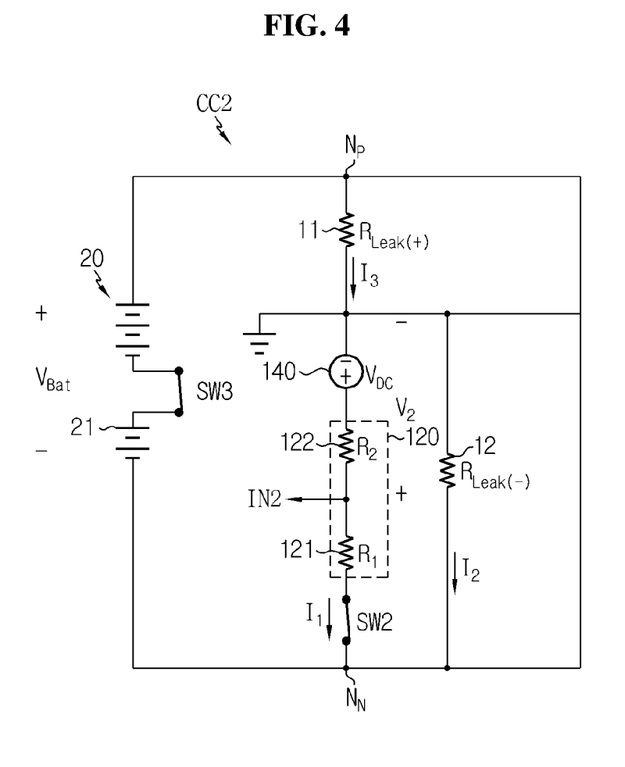
FIG. 4 is a schematic circuit diagram showing a second circuit formed in a battery pack by a second switching mode.

In the second switching mode, the switch driving unit 160 may turn off the first switch SW1 and turn on the second switch SW2 to form a second circuit (CC2 in FIG. 4). The second circuit CC2 refers to a circuit in which the first voltage dividing unit 110 is electrically separated from the positive terminal $N_P$, and the second voltage dividing unit 120 is electrically connected to the negative terminal $N_N$.

In the third switching mode, the switch driving unit 160 may turn on both the first switch SW1 and the second switch SW2 to form a third circuit (not shown). The third circuit refers to a circuit in which the first voltage dividing unit 110 is electrically connected to the positive terminal $N_P$, and the second voltage dividing unit 120 is electrically connected to the negative terminal $N_N$.

In the fourth switching mode, the switch driving unit 160 may turn off both the first switch SW1 and the second switch SW2 to form a fourth circuit (not shown). The fourth circuit refers to a circuit in which the first reference resistor 112 is not electrically connected to the positive terminal $N_P$ and the second reference resistor 122 is not electrically connected to the negative terminal $N_N$.

The switch driving unit 160 may control the safety switch SW3 independently from the first switch SW1 and the second switch SW2.

The voltage measuring unit 150 measures the terminal voltage $V_{Bat}$ of the battery 20. To this end, the voltage measuring unit 150 may be electrically connected to each of a node of connection between the first switch SW1 and the first voltage dividing unit 110 and a node of connection between the second switch SW2 and the second voltage dividing unit 120. The terminal voltage $V_{Bat}$ of the battery 20 may be measured by the voltage measuring unit 150 when the third switching mode is executed. Alternatively, a voltage sensor (not shown) provided separately from the voltage measuring unit 150 may measure the terminal voltage $V_{Bat}$ of the battery 20, and output a measurement signal indicating the measured terminal voltage $V_{Bat}$ to the controller 170.

The voltage measuring unit 150 may measure each of the voltage (hereinafter referred to as 'first detected voltage' or '$V_1$') applied between the first common node $N_{C1}$ and the ground and the voltage (hereinafter referred to as 'second detected voltage' or '$V_2$') applied between the second common node $N_{C2}$ and the ground at the same time or at different times. The first detected voltage may be equal to the voltage across two ends of the first reference resistor 112, and the second detected voltage may be equal to the sum of the voltage across two ends of the second reference resistor 122 and $V_{DC}$.

The voltage measuring unit 150 may include a first input port IN1 connected to the first common node $N_{C1}$ and a second input port IN2 connected to the second common node $N_{C2}$. The voltage measuring unit 150 may include a voltage sensor and an Analog-Digital Converter (ADC). The voltage sensor outputs an analog signal corresponding to a potential formed in the first input port IN1 and an analog signal corresponding to a potential formed in the second input port IN2 to the ADC. The ADC may convert the analog signal corresponding to the potential formed in the first input port IN1 to a digital signal, and the analog signal corresponding to the potential formed in the second input port IN2 to a digital signal.

The controller 170 is operably coupled to the voltage measuring unit 150 and the switch driving unit 160. The controller 170 controls the switch driving unit 160 based on the measurement signals outputted from the voltage measuring unit 150. The controller 170 may be physically implemented including at least one of application specific integrated circuits (ASICs), digital signal processors (DSPs), digital signal processing devices (DSPDs), programmable logic devices (PLDs), field programmable gate arrays (FPGAs), microprocessors and electrical units for performing other functions. Additionally, the controller 170 may have the memory embedded therein. The memory may additionally store data, instructions and software required for the entire operation of the apparatus 100. The memory may include at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) and programmable read-only memory (PROM).

Hereinafter, the process in which the battery leakage detection apparatus 100 according to the present disclosure calculates each of the resistance value of the first insulation resistor 11 and the resistance value of the second insulation resistor 12 will be described with reference to FIGS. 3 to 5. Now, the resistance value of the first insulation resistor 11 is referred to as a 'first insulation resistance value' or '$R_{Leak(+)}$', and the resistance value of the second insulation resistor 12 is referred to as a 'second insulation resistance value' or '$R_{Leak(-)}$'.

FIG. 3 is a schematic circuit diagram showing the first circuit CC1 formed in the battery pack 10 by the first switching mode. When some time has passed from the start time of the first switching mode, it turns into a stable state in which the first detected voltage does not change any longer over time due to the parasitic capacitors $CP_{(+)}$, $CP_{(-)}$. Accordingly, for convenience of description, the parasitic capacitors $C_{P(+)}$, $C_{P(-)}$ are omitted herein.

Referring to FIG. 3, $I_1$ denotes the current flowing from the first protection resistor 111 to the first reference resistor 112, $I_2$ denotes the current flowing from the positive terminal $N_P$ to the first insulation resistor 11, and $I_3$ denotes the current flowing from the second insulation resistor 12 to the negative terminal $N_N$.

The first detected voltage $V_1$ is expressed as the following Equation 1.

$$V_1 = I_1 R_2 \qquad \text{<Equation 1>}$$

Rewriting Equation 1 for $I_1$, the following Equation 2 is presented.

$$I_1 = \frac{V_1}{R_2} \qquad \text{<Equation 2>}$$

As the first voltage dividing unit 110 and the first insulation resistor 11 are electrically connected in parallel, a relationship represented as the following Equation 3 is established.

$$I_1 R_1 + V_1 = I_2 R_{Leak(+)} \qquad \text{<Equation 3>}$$

Rewriting Equation 3 using Equation 2, the following Equation 4 is derived.

$$I_2 = \frac{I_1 R_1 + V_1}{R_{Leak(+)}} = \frac{\left(\frac{V_1}{R_2}\right) R_1 + V_1}{R_{Leak(+)}} \qquad \text{<Equation 4>}$$

Meanwhile, when Kirchhoff's current law is applied to the first circuit CC1, the following Equation 5 is derived.

$$I_1 + I_2 = I_3 \qquad \text{<Equation 5>}$$

Substituting the above Equations 2 and 4 into the above Equation 5 and rewriting it for $I_3$, the following Equation 6 is presented.

$$I_3 = \frac{V_1}{R_2} + \frac{\left(\frac{V_1}{R_2}\right) R_1 + V_1}{R_{Leak(+)}} \qquad \text{<Equation 6>}$$

Meanwhile, in case that the terminal voltage of the battery 20 is $V_{Bat}$, when Kirchhoff's voltage law is applied to the first circuit CC1, the formula for the first term included in the following Equation 7 is derived. Additionally, rewriting the formula for the first term using $I_2$ and $I_3$ obtained through the above Equations 4 and 6, the formula for the last term included in the following Equation 7 is derived.

$$V_{Bat} = I_2 R_{Leak(+)} + I_3 R_{Leak(-)} \qquad \text{<Equation 7>}$$

$$V_{Bat} = \left(\frac{\left(\frac{V_1}{R_2}\right) R_1 + V_1}{R_{Leak(+)}}\right) R_{Leak(+)} +$$

$$\left(\frac{V_1}{R_2} + \frac{\left(\frac{V_1}{R_2}\right) R_1 + V_1}{R_{Leak(+)}}\right) R_{Leak(-)}$$

$$V_{Bat} = \left(\frac{V_1}{R_2}\right) R_1 + V_1 + \left(\frac{V_1}{R_2} + \frac{\left(\frac{V_1}{R_2}\right) R_1 + V_1}{R_{Leak(+)}}\right) R_{Leak(-)}$$

The formula for the last term included in the above Equation 7 is one of two circuit formulae necessary for calculating the first insulation resistance value $R_{Leak(+)}$ and the second insulating resistance $R_{Leak(-)}$.

FIG. 4 is a schematic circuit diagram showing the second circuit CC2 formed in the battery pack 10 by the second switching mode. Similar to the above-described first switching mode, when a predetermined time has passed from the start time of the second switching mode, it turns into a stable state in which the second detected voltage does not change any longer over time due to the parasitic capacitors $CP_{(+)}$, $CP_{(-)}$. Accordingly, for convenience of description, the parasitic capacitors $C_{P(+)}$, $C_{P(-)}$ are omitted herein.

Referring to FIG. 4, $I_1$ denotes the current flowing from the second reference resistor 122 to the second protection resistor 121, $I_2$ denotes the current flowing from the second insulation resistor 12 to the negative terminal $N_N$, and $I_3$ denotes the current from the positive terminal $N_P$ to the first insulation resistor 11.

The second detected voltage $V_2$ is expressed as the following Equation 8.

$$V_2 = V_{DC} - I_1 R_2 \quad \text{<Equation 8>}$$

Rewriting the above Equation 8 for $I_1$, the following Equation 9 is presented.

$$I_1 = \frac{V_{DC} - V_2}{R_2} \quad \text{<Equation 9>}$$

As the second insulation resistor 12 is electrically connected in parallel to a simple series circuit of the second voltage dividing unit 120 and the direct current voltage source 140, a relationship represented as the following Equation 10 is established.

$$I_1 R_1 - V_2 = I_2 R_{Leak(-)} \quad \text{<Equation 10>}$$

Rewiring Equation 10 using Equation 9, the following Equation 11 is derived.

$$I_2 = \frac{I_1 R_1 - V_2}{R_{Leak(-)}} = \frac{\left(\frac{V_{DC} - V_2}{R_2}\right) R_1 - V_2}{R_{Leak(-)}} \quad \text{<Equation 11>}$$

Meanwhile, when Kirchhoff's current law is applied to the second circuit CC2, the following Equation 12 is derived.

$$I_3 = I_1 + I_2 \quad \text{<Equation 12>}$$

Substituting the above Equations 9 and 11 into the above Equation 12 and rewriting it for $I_3$, the following Equation 13 is presented.

$$I_3 = \frac{V_{DC} - V_2}{R_2} + \frac{\left(\frac{V_{DC} - V_2}{R_2}\right) R_1 - V_2}{R_{Leak(-)}} \quad \text{<Equation 13>}$$

Meanwhile, in case that the terminal voltage of the battery 20 is $V_{Bat}$, when Kirchhoff's voltage law is applied to the second circuit CC2, the formula for the first term included in the following Equation 14 is derived. Additionally, rewriting the formula for the first term using $I_2$ and $I_3$ obtained through the above Equations 11 and 13, the formula for the last term included in the following Equation 14 is derived.

$$V_{Bat} = I_2 R_{Leak(-)} + I_3 R_{Leak(+)} \quad \text{<Equation 14>}$$

$$V_{Bat} = \left(\frac{\left(\frac{V_{DC} - V_2}{R_2}\right) R_1 - V_2}{R_{Leak(-)}}\right) R_{Leak(-)} +$$

$$\left(\frac{V_{DC} - V_2}{R_2} + \frac{\left(\frac{V_{DC} - V_2}{R_2}\right) R_1 + V_2}{R_{Leak(+)}}\right) R_{Leak(+)}$$

$$V_{Bat} = \left(\frac{V_{DC} - V_2}{R_2}\right) R_1 - V_2 +$$

$$\left(\frac{V_{DC} - V_2}{R_2} + \frac{\left(\frac{V_{DC} - V_2}{R_2}\right) R_1 - V_2}{R_{Leak(-)}}\right) R_{Leak(+)}$$

The formula for the last term included in the above Equation 14 is one of two circuit formulae for calculating the first insulation resistance value $R_{Leak(+)}$ and the second insulation resistance value $R_{Leak(-)}$.

The solution of a simultaneous equation including the formula for the last term in Equation 7 and the formula for the last term in Equation 14 is expressed as the following Equation 15.

$$R_{Leak(+)} = \frac{(V_{Bat} - A)(V_{Bat} - C) - AC}{D(V_{Bat} - A) + BC} \quad \text{<Equation 15>}$$

$$R_{Leak(-)} = \frac{(V_{Bat} - A)(V_{Bat} - C) - AC}{B(V_{Bat} - A) + AD}$$

$$\therefore A = \left(\frac{V_1}{R_2}\right) R_1 + V_1$$

$$\therefore B = \frac{V_1}{R_2}$$

$$\therefore C = \left(\frac{V_{DC} - V_2}{R_2}\right) R_1 - V_2$$

$$\therefore D = \frac{V_{DC} - V_2}{R_2}$$

In Equation 15, each of $R_1$, $R_2$ and $V_{DC}$ is preset, and each of $V_{Bat}$, $V_1$ and $V_2$ is measured by the voltage measuring unit 150. The voltage measuring unit 150 outputs each measurement signal indicating $V_{Bat}$, $V_1$ and $V_2$ to the controller 170. $V_1$ and $V_2$ may be each measured within a preset period (e.g., 5 sec) before and after the measurement time of $V_{Bat}$.

The controller 170 may calculate each of the first insulation resistance value $R_{Leak(+)}$ and the second insulation resistance value $R_{Leak(-)}$ using the above Equation 15 based on the $V_{Bat}$, $V_1$ and $V_2$ indicated by the measurement signals outputted from the voltage detection unit 130.

The controller 170 diagnoses the first and second insulation resistors 11, 12 between the battery 20 and the ground by comparing at least one of the first insulation resistance value $R_{Leak(+)}$ and the second insulation resistance value $R_{Leak(-)}$ with the given reference resistance value. That is, the controller 170 monitors if the first insulation resistance value $R_{Leak(+)}$ or the second insulation resistance value $R_{Leak(-)}$ is equal to or less than the reference resistance value.

The battery leakage detection apparatus 100 may further include a communication unit 181 for communication with an external device (e.g., an Electronic Control Unit (ECU) of a vehicle). In this case, the controller 170 may transmit the diagnosis results of the first and second insulation resistors 11, 12 to the external device 30 through the communication unit 181.

The battery leakage detection apparatus 100 may further include a warning unit 182 to visually or audibly output information corresponding to the diagnosis results of the first and second insulation resistors 11, 12. In this case, the controller 170 may output a warning message through the warning unit 182 when the insulation state between the battery 20 and the ground is not properly maintained. For example, the warning unit 182 may include a Light Emitting Diode (LED), a Liquid Crystal Display (LCD), an alarm or their combination.

The controller 170 may include a processor, an application-specific integrated circuit (ASIC), a chipset, a logic circuit, a register, a communication modem and a data processing device known in the technical field to which the present disclosure belongs, to calculate the insulation resistance using the previously described Equation 15 and execute various control logics.

Figure 5:
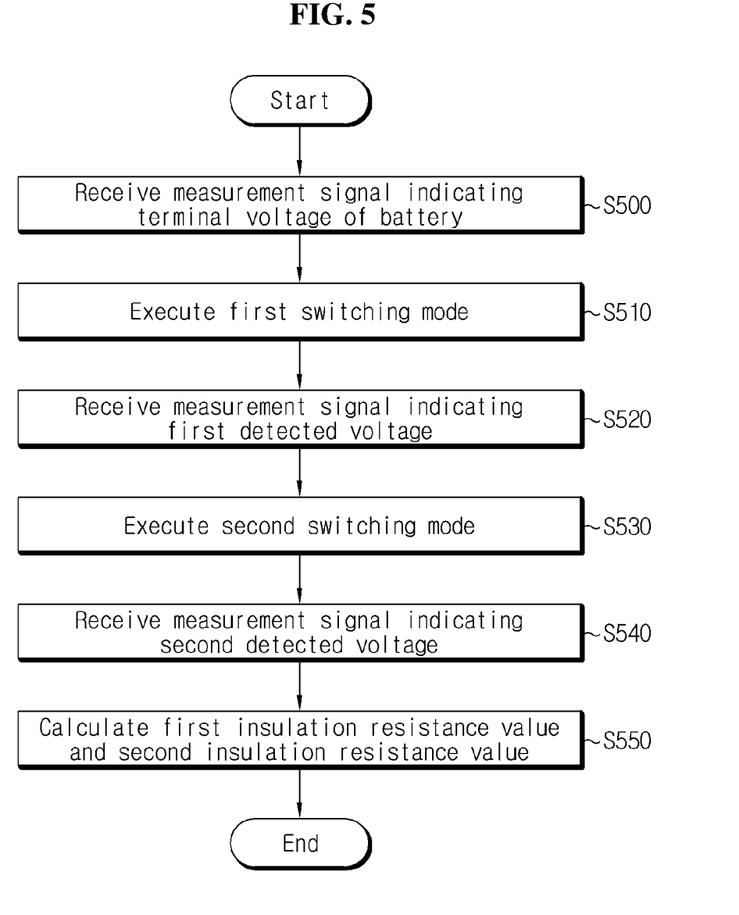
FIG. 5 is a flowchart showing an exemplary method for calculating an insulation resistance value between a battery and a ground according to an embodiment of the present disclosure.

FIG. 5 is a flowchart showing an exemplary method for calculating the insulation resistance value between the battery and the ground according to an embodiment of the present disclosure. The method of FIG. 5 may be performed repeatedly at a predetermined time interval.

Referring to FIG. 5, in step S500, the controller 170 receives a measurement signal indicating the terminal voltage $V_{bat}$ of the battery 20 from the voltage measuring unit 150.

In step S510, the controller 170 executes the first switching mode. When the first switching mode is executed, the switch driving unit 160 outputs a first switching signal (e.g., a preset high level of voltage) to the first switch SW1 and a second switching signal (e.g., a preset low level of voltage) to the second switch SW2. Accordingly, the first switch SW1 is turned on in response to the first switching signal, and the second switch SW2 is turned off in response to the second switching signal.

In step S520, the controller 170 receives a measurement signal indicating the first detected voltage $V_1$ from the voltage measuring unit 150 while the first switching mode is being executed. That is, the first detected voltage $V_1$ is measured by the voltage measuring unit 150 while the first switching mode is being executed.

In step S530, the controller 170 executes the second switching mode. When the second switching mode is executed, the switch driving unit 160 outputs the second switching signal to the first switch SW1 and the first switching signal to the second switch SW2. Accordingly, the first switch SW1 is turned off in response to the second switching signal, and the second switch SW2 is turned on in response to the first switching signal.

In step S540, the controller 170 receives a measurement signal indicating the second detected voltage $V_2$ from the voltage measuring unit 150 while the second switching mode is being executed. That is, the second detected voltage $V_2$ is measured by the voltage measuring unit 150 while the second switching mode runs.

In step S550, the controller 170 calculates each of a first insulation resistance value $R_{Leak(+)}$ and a second insulation resistance value $R_{Leak(-)}$. In this case, the controller 170 may calculate each of the first insulation resistance value $R_{Leak(+)}$ and the second insulation resistance value $R_{Leak(-)}$ based on $V_{Bat}$, $V_1$ and $V_2$ using Equation 15. The controller 170 may store the first insulation resistance value $R_{Leak(+)}$ and the second insulation resistance value $R_{Leak(-)}$ in the memory.

Figure 6:
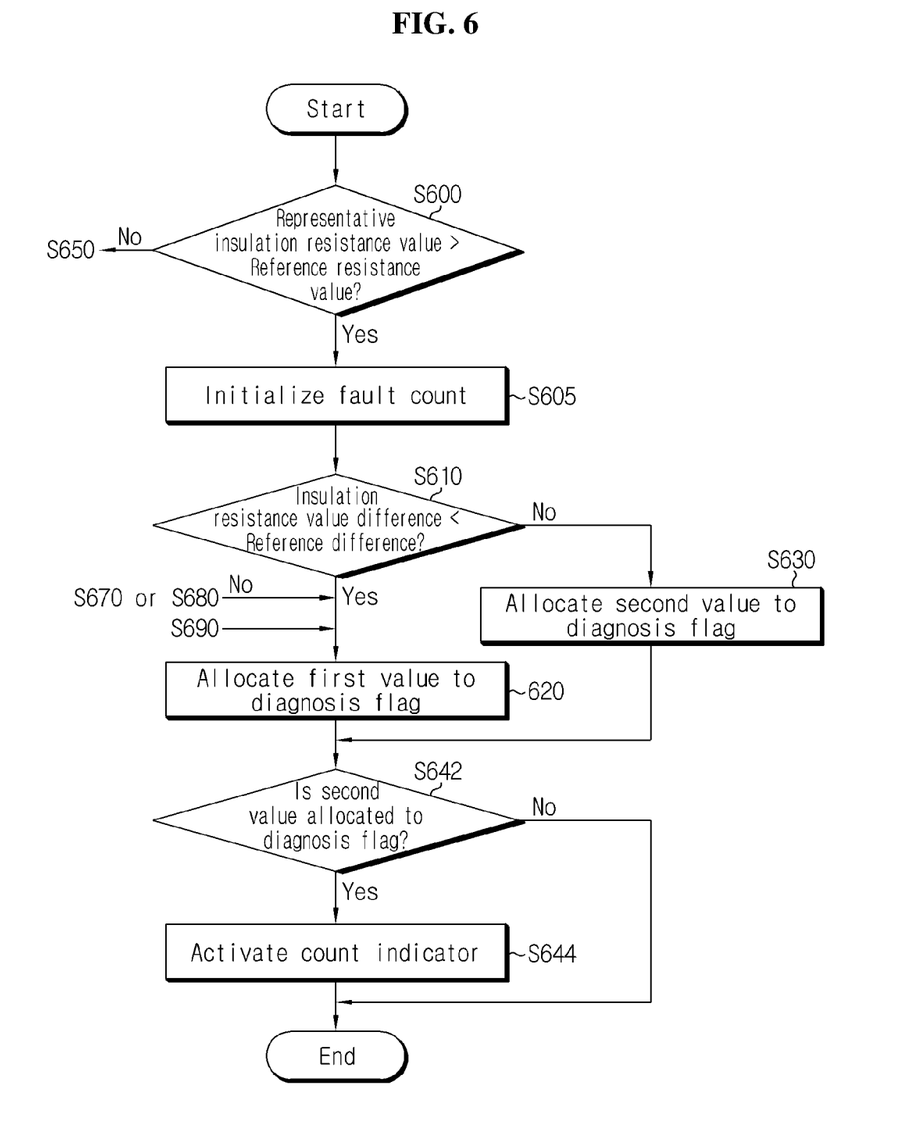
FIGS. 6 and 7 are flowcharts showing an exemplary method for detecting battery leakage according to another embodiment of the present disclosure.
Figure 7:
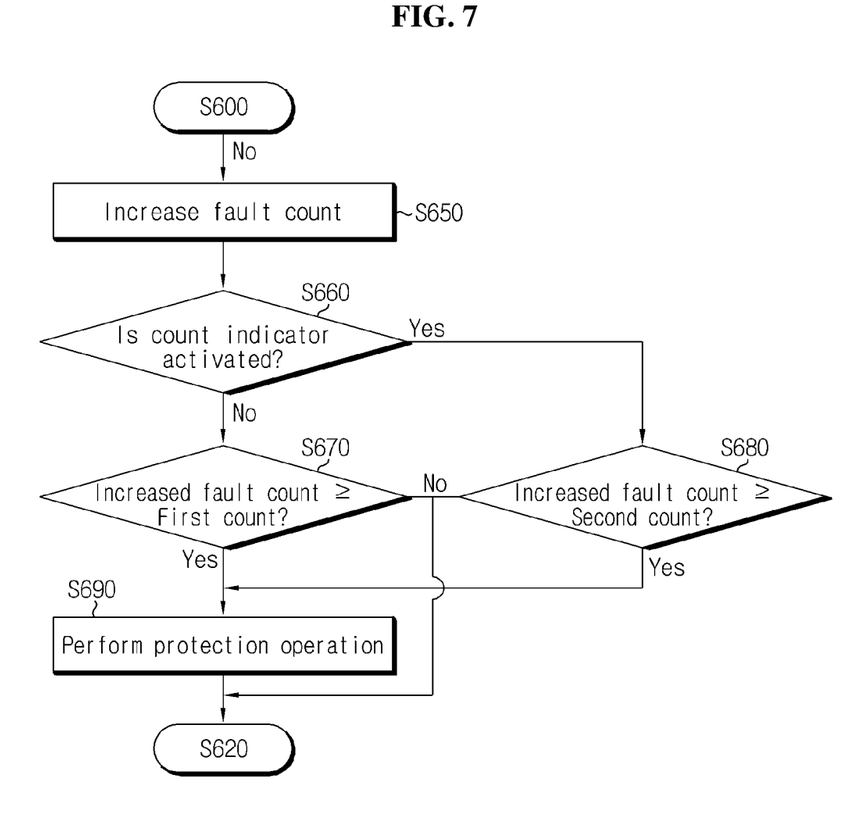
Figure 8:
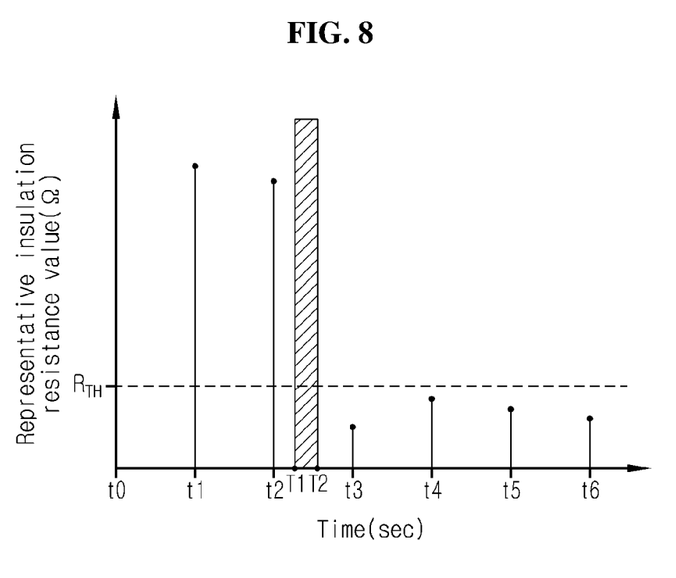
FIGS. 8 and 9 are exemplary different graphs for reference in describing the method of FIGS. 6 and 7.
Figure 9:
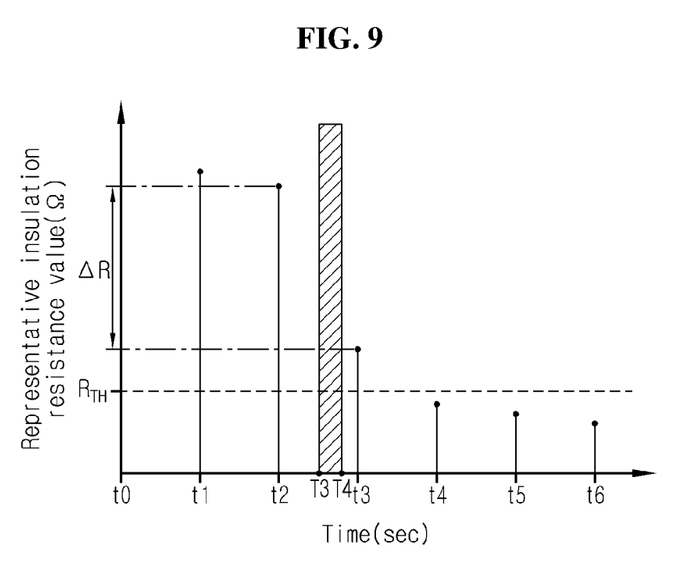

FIGS. 6 and 7 are flowcharts showing an exemplary method for detecting battery leakage according to another embodiment of the present disclosure, and FIGS. 8 and 9 are exemplary different graphs for reference in describing the method of FIGS. 6 and 7. The method of FIGS. 6 and 7 is performed after calculating each of the first insulation resistance value $R_{Leak(+)}$ and the second insulation resistance value $R_{Leak(-)}$ through the method of FIG. 5, and may be repeatedly performed once each time at the predetermined time interval.

Referring to FIGS. 6 and 7, in step S600, the controller 170 determines whether a representative insulation resistance value is larger than the preset reference resistance value (see $R_{TH}$ in FIGS. 8 and 9). The representative insulation resistance value may be any one of the first insulation resistance value $R_{Leak(+)}$ and the second insulation resistance value $R_{Leak(-)}$, for example, a smaller one of the first insulation resistance value $R_{Leak(+)}$ and the second insulation resistance value $R_{Leak(-)}$. When the value of the step S600 is "YES", step S605 is performed. When the value of the step S600 is "NO", namely, when the representative insulation resistance value is equal to or less than the reference resistance value, step S650 is performed.

In step S605, the controller 170 initiates a fault count. The fault count may be set to a specific value, for example, 0, by the initialization. The fault count may indicate the number of times the representative insulation resistance value is consecutively calculated to be equal to or less than the preset reference resistance value.

In step S610, the controller 170 determines whether an insulation resistance value difference is smaller than a preset reference difference. The insulation resistance value difference is a difference between the previous representative insulation resistance value and the above-described representative insulation resistance value. That is, the insulation resistance value difference=| the previous representative insulation resistance value–the above-described representative insulation resistance value|.

When at least one of $V_1$ and $V_2$ is measured while the insulation between the battery 20 and the ground is destroyed or for a very short time during which a temporary error occurs in the voltage measuring unit 150, the first insulation resistance value $R_{Leak(+)}$ or the second insulation resistance value $R_{Leak(-)}$ may sharply increase or decrease toward the reference resistance value $R_{TH}$. Accordingly, the insulation resistance value difference equal to or larger than the preset reference difference indicates that a representative insulation resistance value to be determined next time will be equal to or less than the reference resistance value.

When the value of the step S610 is "YES", step S620 is performed. When the value of the step S610 is "NO", step S630 is performed.

In step S620, the controller 170 allocates a first value (e.g., 0) to a diagnosis flag. The first value indicates that the representative insulation resistance value is valid. Additionally, allocation of the first value to the diagnosis flag may represent initialization of the diagnosis flag.

In step S630, the controller 170 allocates a second value (e.g., 1) to the diagnosis flag. The second value indicates that the representative insulation resistance value is invalid.

In step S642, the controller 170 determines whether the second value is allocated to the diagnosis flag. Allocation of the second value to the diagnosis flag represents that step S630 was performed in the previous cycle. On the contrary, a failure to allocate the second value to the diagnosis flag, that is, allocation of the first value to the diagnosis flag represents that step S620 was performed in the previous cycle. When the value of step S642 is "YES", step S644 is performed. When the value of step S642 is "NO", the method ends.

In step S644, the controller 170 activates a count indicator.

Referring to FIG. 7, as described above, step S650 may be performed when the value of the step S600 is "NO". In step S650, the controller 170 increases the fault count. That is, the controller 170 increases the fault count each time the representative insulation resistance value is determined to be equal to or less than the preset reference resistance value. The fault count is a value that is updated by the controller 170 each time, and indicates the number of times the representative insulation resistance value has been consecutively determined to be equal to or less than the preset reference resistance value until now.

In step S660, the controller 170 determines whether the count indicator is activated. When the value of the step S660 is "NO", step S670 is performed. When the value of the step S660 is "YES", step S680 is performed.

In step S670, when the count indicator is not activated, the controller 170 determines whether the increased fault count is equal to or larger than a preset first count. In step S650, when the fault count is programmed to increase by 1, the first count may be 2 or greater (preferably, 3 or greater). When the value of the step S670 is "YES", step S690 is performed. When the value of the step S670 is "NO", the method according to FIGS. 6 and 7 may end.

In step S680, when the count indicator is activated, the controller 170 determines whether the increased fault count is equal to or larger than a preset second count. In this instance, the preset second count is smaller than the preset first count. For example, in step S650, when the fault count is programmed to increase by 1 and the first count is 10, the second count may be any one of 1~9. When the value of the step S680 is "YES", step S690 is performed. When the value of the step S680 is "NO", the method according to FIGS. 6 and 7 may end.

The value of the step S670 or S680 being "YES" represents that the battery leakage is detected. Accordingly, in step S690, the controller 170 performs a preset protection operation. In an example, the protection operation may include notifying the insulation resistance values. That is, the controller 170 may transmit a signal indicating the first insulation resistance value $R_{Leak(+)}$ and the second insulation resistance value $R_{Leak(-)}$ to the external device 30 through the communication unit 181. In another example, the protection operation may include warning. That is, the controller 170 may output the warning message through the warning unit 182. In still another example, the protection operation may include turning off the safety switch SW3. That is, the controller 170 may turn off the safety switch SW3 using the switch driving unit 160.

FIGS. 8 and 9 shows an exemplary change in the representative insulation resistance value over time when the predetermined time is set to 10 sec, the first count is set to 3 and the second count is set to 2. Because the predetermined time is 10 sec, when i=1~6, $t_{i+1}-t_i=10$ sec. Now, assume that the representative insulation resistance value calculated at the time $t_i$ is based on $V_{Bat}$, $V_1$ and $V_2$ measured in the time range of $(t_i-3$ sec$)$~$(t_i-1$ sec$)$.

The graph of FIG. 8 shows an exemplary change in the representative insulation resistance value over time. Referring to FIG. 8, a period between the time T1 and the time T2 denotes a period during which breakdown of the insulation between the battery 20 and the ground continues, or a period during which a temporary error is present in the voltage measuring unit 150. In this instance, if the time T2 is earlier than the time $(t_3-3$ sec$)$, the representative insulation resistance value calculated at $t_3$ is not affected by a situation occurred within the period between T1 and T2. Accordingly, the preset first count is utilized for battery leakage diagnosis. The controller 170 may perform the protection operation in response to the representative insulation resistance value that is equal to or less than the preset reference resistance value consecutively three times (=the preset first count) at the time $t_3$, the time $t_4$ and the time $t_5$.

The graph of FIG. 9 shows an exemplary change in the representative insulation resistance value over time. Referring to FIG. 9, a period between the time T3 and the time T4 denotes a period during which breakdown of the insulation between the battery 20 and the ground continues, or a period during which a temporary error is present in the voltage measuring unit 150. Contrary to FIG. 8, if the time T4 is later than the time $(t_3-3$ sec$)$, the representative insulation resistance value calculated at $t_3$ is affected by the situation occurred within the period between T3 and T4, and thus a difference between the previous representative insulation resistance value calculated at $t_2$ and the representative insulation resistance value calculated at $t_3$, i.e., the insulation resistance value difference $\Delta R$, may be equal to or larger than the preset reference difference. Accordingly, the count indicator is activated, and instead of the preset first count, the preset second count smaller than the preset first count is utilized for battery leakage diagnosis. The controller 170 may perform the protection operation in response to the representative insulation resistance value that is equal to or less than the preset reference resistance value consecutively twice (=the preset second count) at the time $t_4$ and the time $t_5$.

The embodiments of the present disclosure described hereinabove are not implemented only through the apparatus and method, and may be implemented through programs that realize the functions corresponding to the configurations of the embodiments of the present disclosure or recording media having the programs recorded thereon, and this implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and some or all the embodiments may be selectively combined together to make various modifications.

What is claimed is:

1. A method for detecting battery leakage, comprising:
    calculating a representative insulation resistance value indicating an insulation state between a battery and a ground;
    determining whether the representative insulation resistance value is larger than a preset reference resistance value;
    determining whether an insulation resistance value difference is smaller than a preset reference difference when the representative insulation resistance value is larger than the preset reference resistance value, wherein the insulation resistance value difference is a difference between a previous representative insulation resistance value and the representative insulation resistance value;
    allocating a first value to a diagnosis flag when the insulation resistance value difference is smaller than the preset reference difference;
    allocating a second value to the diagnosis flag when the insulation resistance value difference is equal to or larger than the preset reference difference; and
    activating a count indicator when the second value is allocated to the diagnosis flag, wherein the first value indicates that the representative insulation resistance value is valid, and the second value indicates that the representative insulation resistance value is invalid.

2. The method according to claim 1, wherein the representative insulation resistance value is a smaller one of:
a first insulation resistance value between a positive terminal of the battery and the ground; and
a second insulation resistance value between a negative terminal of the battery and the ground.

3. The method according to claim 1, further comprising:
increasing a fault count value when the representative insulation resistance value is equal to or less than the preset reference resistance value;
determining whether the count indicator is activated when the representative insulation resistance value is equal to or less than the preset reference resistance value;
after increasing the fault count value, determining whether the fault count value is equal to or larger than a preset first count value when the count indicator is not activated; and
performing a protection operation when the increased fault count value is equal to or larger than the preset first count value.

4. The method according to claim 3, further comprising:
after increasing the fault count value, determining whether the fault count value is equal to or larger than a preset second count value when the count indicator is activated; and
performing the protection operation when the fault count value is equal to or larger than the preset second count value.

5. The method according to claim 4, wherein the preset second count value is smaller than the preset first count value.

6. The method according to claim 3, wherein the protection operation includes turning off a safety switch installed between two adjacent battery cells connected in series within the battery.

7. An apparatus for detecting battery leakage, comprising:
a switching unit including a first switch and a second switch;
a first voltage dividing unit including a first protection resistor and a first reference resistor, wherein the first protection resistor and the first reference resistor are connected in series between a positive terminal of a battery and a ground when the first switch is turned on;
a second voltage dividing unit including a second protection resistor and a second reference resistor, wherein the second protection resistor and the second reference resistor are connected in series between a negative terminal of the battery and the ground when the second switch is turned on;
a voltage sensor configured to measure a first detected voltage from the first voltage dividing unit and a second detected voltage from the second voltage dividing unit;
a switch control configured to independently control the first switch and the second switch; and
a controller configured to:
calculate:
a first insulation resistance value between the positive terminal of the battery and the ground; and
a second insulation resistance value between the negative terminal of the battery and the ground,
based on the first detected voltage measured by the voltage sensor while a first circuit is formed by the first switch being turned on and the second switch being turned off and based on the second detected voltage measured by the voltage sensor while a second circuit is formed by the first switch being turned off and the second switch is-being turned on;
determine whether a representative insulation resistance value is larger than a preset reference resistance value, wherein the representative insulation resistance value is either one of the first insulation resistance value or the second insulation resistance value;
determine whether an insulation resistance value difference is smaller than a preset reference difference when the representative insulation resistance value is larger than the preset reference resistance value, wherein the insulation resistance value difference is a difference between a previous representative insulation resistance value and the representative insulation resistance value;
allocate a first value to a diagnosis flag when the insulation resistance value difference is smaller than the preset reference difference;
allocate a second value to the diagnosis flag when the insulation resistance value difference is equal to or larger than the preset reference difference;
activate a count indicator when the second value is allocated to the diagnosis flag;
increase a fault count value when the representative insulation resistance value is equal to or less than the preset reference resistance value;
after the fault count value is increased, determine whether the fault count value is equal to or larger than a preset first count value when the count indicator is not activated; and
perform a protection operation when the increased fault count value is equal to or larger than the preset first count value,
wherein the first value indicates that the representative insulation resistance value is valid, and
wherein the second value indicates that the representative insulation resistance value is invalid.

8. The apparatus according to claim 7, wherein the controller is configured to:
after the fault count value is increased, determine whether the fault count value is equal to or larger than a preset second count value when the count indicator is activated, wherein the preset second count value is smaller than the preset first count value; and
perform the protection operation when the fault count value is equal to or larger than the preset second count value.

9. The apparatus according to claim 7, wherein the protection operation includes turning off a safety switch installed between two adjacent battery cells connected in series within the battery.

10. A battery pack comprising the apparatus according to claim 7.

* * * * *